United States Patent [19]
Sakuraba et al.

[11] Patent Number: 6,071,592
[45] Date of Patent: Jun. 6, 2000

[54] METAL-CERAMIC COMPOSITE SUBSTRATE

[75] Inventors: Masami Sakuraba; Masami Kimura; Junji Nakamura; Masaya Takahara, all of Tokyo, Japan

[73] Assignee: Dowa Mining Co., Ltd., Tokyo, Japan

[21] Appl. No.: 08/898,880

[22] Filed: Jul. 23, 1997

[51] Int. Cl.[7] .................................................. D06N 7/04
[52] U.S. Cl. ..................... 428/141; 428/469; 428/698; 428/702; 428/312.2; 428/632; 428/627; 428/612; 428/174
[58] Field of Search ................... 428/469, 472, 428/698, 702, 312.2, 312.8, 632, 627, 612, 174, 141, 156; 174/260; 228/122.1

[56] References Cited

U.S. PATENT DOCUMENTS

| | | | |
|---|---|---|---|
| 4,409,278 | 10/1983 | Jochym | 428/163 |
| 4,591,535 | 5/1986 | Mizuhara | 428/627 |
| 4,630,767 | 12/1986 | Mizuhara | 228/122 |
| 4,678,720 | 7/1987 | Hsu et al. | 428/606 |
| 4,698,271 | 10/1987 | Moorhead | 428/621 |
| 4,811,893 | 3/1989 | Kanahara et al. | 228/198 |
| 4,959,507 | 9/1990 | TanaKa et al. | 174/260 |
| 5,153,077 | 10/1992 | Kashiba et al. | 428/627 |
| 5,403,672 | 4/1995 | Urasaki et al. | 428/607 |
| 5,465,898 | 11/1995 | Schulz-Harder et al. | 228/122.1 |
| 5,525,432 | 6/1996 | Do-Thoi et al. | 428/627 |
| 5,585,672 | 12/1996 | Koike et al. | 257/707 |
| 5,622,769 | 4/1997 | Kozuka et al. | 428/209 |
| 5,672,848 | 9/1997 | Komorita et al. | 174/260 |

FOREIGN PATENT DOCUMENTS

| | | |
|---|---|---|
| 0 013 314 | 7/1980 | European Pat. Off. . |
| 0 214 465 | 3/1987 | European Pat. Off. . |
| 0 339 881 | 11/1989 | European Pat. Off. . |
| 62-296959 | 12/1987 | Japan ........................ B23K 1/12 |
| 63-170289 | 7/1988 | Japan . |

OTHER PUBLICATIONS

Patent Abstracts of Japan, vol. 095, No. 009, Oct. 1995 & JP 07 162105, Jun. 1995.

Patent Abstracts of Japan, vol. 095, No. 006, Jul. 1995 & JP 07 066507, Mar. 1995.

Patent Abstracts of Japan, vol. 014, No. 239, May 1990 & JP 02 065263, Mar. 1990.

*Primary Examiner*—William Krynski
*Assistant Examiner*—B. Shewareged
*Attorney, Agent, or Firm*—Nilles & Nilles SC

[57] ABSTRACT

A metal-ceramic composite circuit substrate having a ceramic substrate and a metal plate joined to at least one main surface of the ceramic substrate, the rate of voids formed on at least a joint surface at a semiconductor mounting portion of the metal plate per unit surface area being not more than 1.49%. The diameter of void formed on at least the joint surface at a semiconductor mounting portion of the metal plate is not larger than 0.7 mm. The surface undulation of the ceramic substrate is not more than 15 $\mu$m/20 mm measured by a surface roughness tester in case that the ceramic substrate is joined directly to the metal plate. The metal plate is joined to the ceramic substrate through a brazing material containing at least one active metal selected from a group consisting of Ti, Zr, Hf and Nb. The ceramic substrate is at least one kind of ceramic substrate selected from a group consisting of $Al_2O_3$, AlN, BeO, SiC, $Si_3N_4$ and $ZrO_2$.

2 Claims, No Drawings

METAL-CERAMIC COMPOSITE SUBSTRATE

BACKGROUND OF THE INVENTION

1. Field of the Invention

The present invention relates to a metal-ceramic composite substrate and, more particularly, relates to an improvement of a metal-ceramic composite substrate wherein heat generated in a semiconductor element can be dissipated therefrom efficiently.

2. Description of the Prior Art

Several methods are known in the art of joining metal members to ceramic members.

A typical example is the direct joining method in which the metal member is directly joined to the ceramic member.

Another example is the intermediate material method in which the metal member is joined to the ceramic member by inserting an intermediate material therebetween.

In the direct joining method, a copper plate is directly joined to an alumina substrate in the atmosphere of inert gas and heated and cooled is described, e.g., in U.S. Pat. No. 4,811,893 etc.

As the intermediate material method, an active metal method and a metalizing method are known.

In the active metal method, an intermediate material containing an element of fourth group of the periodic table, such as Ti or Zr etc., or an alloy containing said element is inserted between the metal member and the ceramic member.

For example, in the case that the stainless steel and the silicon nitride are joined, Ag—Cu—Ti base alloy is used as the intermediate material, and in the case that the copper and the alumina are joined, Cu—Ti base alloy is used as the intermediate material.

Recently, however, it is required to use semiconductor elements of a high electrical power and high integration to be mounted in the electronic equipment including the semiconductor device according to the miniaturization of said electronic equipment, and thus the heat quantity generated in the energized semiconductor elements becomes large.

SUMMARY OF THE INVENTION

An object of the present invention is to solve the technical problems as mentioned above.

Another object of the present invention is to obtain an improved metal-ceramic composite circuit substrate in which voids formed on a joint surface between the metal plate and the ceramic substrate are limited as small as possible, so that the heat quantity generated in the semiconductor can be dissipated efficiently, the heat radiating ability of the semiconductor is not reduced and the weight of the substrate is not increased, and that the heat resistance of the substrate can be reduced without varying the pattern size and increasing the surface area of the substrate.

The present inventors conducted intensive studies in order to attain the stated objects and found that the heat generated in the semiconductor could be dissipated with no problem by controlling the rate of voids and the diameter of void on the joint surface between the metal plate and the ceramic substrate.

The present invention has been accomplished on the basis of this finding.

According to a first aspect of the invention, there is provided a metal-ceramic composite substrate characterized by comprising a ceramic substrate and a metal plate joined to at least one main surface of the ceramic substrate, in that the rate of voids formed on at least a joint surface at a semiconductor mounting portion of the metal plate per unit surface area is not more than 1.49%.

According to a second aspect of the invention, there is provided a metal-ceramic composite substrate characterized in that the diameter of void formed on at least a joint surface at a semiconductor mounting portion of a metal plate is not larger than 0.7 mm, preferably, 0.5 mm.

According to a third aspect of the invention, there is provided a metal-ceramic composite substrate characterized in that the surface undulation of a ceramic substrate is not more than 15 $\mu$m/20 mm measured by the surface roughness tester in case that the ceramic substrate is joined directly to a metal plate.

According to a fourth aspect of the invention, there is provided a metal-ceramic composite substrate characterized in that a metal plate is joined to a ceramic substrate through a brazing material containing at least one active metal selected from a group consisting of Ti, Zr, Hf and Nb.

According to a fifth aspect of the invention, there is provided a metal-ceramic composite substrate characterized in that a ceramic substrate is at least one kind of ceramic substrate selected from a group consisting of $Al_2O_3$, AlN, BeO, SiC, $Si_3N_4$ and $ZrO_2$.

According to a sixth aspect of the invention, there is provided a metal-ceramic composite substrate, wherein the carbon in the binder of the substrate is eliminated by heating the substrate at a temperature of not less than 600° C. for at least two hours.

In the present invention, at least one kind of member selected from among $Al_2O_3$, AlN, BeO, SiC, $Si_3N_4$ and $ZrO_2$ is used as a ceramic member, and a member having good electrical conductivity such as copper or aluminum is used as a metal plate.

In case that an alumina substrate ($Al_2O_3$) is used as a ceramic member in the present invention, the surface undulation of the alumina substrate should not be more than 15 $\mu$m/20 mm measured by the surface roughness tester, because if the surface undulation is more than said value, the value of the maximum diameter of the void will be increased and the number of the voids each having the diameter not smaller than 100 $\mu$m will be increased, as a result that the rate of voids per unit surface area will be increased in proportion thereto.

Further, in case that as a ceramic member an aluminum nitride substrate or a silicon carbide substrate etc. such as AlN, BeO, SiC, $Si_3N_4$) is used instead of an alumina substrate, the ceramic member is joined to a metal plate by using Ag—Cu base brazing material containing at least one active metal selected from among Ti, Zr, Hf and Nb. In this case, the brazing material in a paste form is used and applied.

In order to prepare the brazing material in the form of paste, an organic solvent such as terpineol, BCA, DBP, methyl cellosolve etc., or an organic binder such as ethyl cellulose etc. of a suitable amount is added to a mixed powder of the brazing material.

Such paste of brazing material is screen printed on the ceramic substrate and the metal plate is superposed on the paste, and then heated in the furnace.

The amount of binder, especially, the amount of carbon contained in the binder to be eliminated, is varied according to the heating temperature and time.

The experiments about the void were carried out by varying the temperature in the furnace to 550° C., 600° C. and 650° C.

The experiments show that the voids of large diameter exist at the binder elimination temperature of 550° C., however, the diameter of void becomes small according to the increase of the binder elimination temperature.

Also, if the heating time is prolonged at constant temperature to eliminate the carbon in the binder, the diameter of void becomes small and the rate of voids per unit surface area is reduced.

The foregoing and other objects, features, and advantages of the present invention will become apparent from the following more particular description of preferred embodiments of the invention.

DESCRIPTION OF THE PREFERRED EMBODIMENTS

Embodiment 1

As metal members, a copper plate of 0.3 mm in thickness for the circuit side and a copper plate of 0.25 mm in thickness for the heat sink side were prepared. Also, as ceramic members, alumina substrates of 30×50×0.635 mm in dimension each having a different surface undulation value were prepared.

A required metal-ceramic composite substrate was obtained by contacting the copper plates with both main surfaces of the alumina substrate, heating and cooling in the atmosphere of inert gas to form a joint member, and etching the joint member to form a predetermined circuit.

In each of these metal-ceramic composite substrates, the maximum diameter of the void, and the number and the rate of voids, (each having a diameter not smaller than 100 $\mu$m per 15 cm$^2$) formed on the joint surface between the alumina substrate and the copper plate for circuit side at a portion where the semiconductor element (such as Si tip etc.) is mounted, were measured by using a supersonic crack detection device (mi-scope-i) manufactured by Hitachi Kenki in Japan. The 'rate of voids' means the percentage, on a per unit surface area basis, of the total surface area occupied by the surface area of the voids.

The results are shown in Table 1.

In these measurements, the supersonic crack detecting conditions were set such that the image of voids detected by the supersonic crack detection device is in accord with the void diameter obtained by the actual observation of the cutting surface at the void portion.

TABLE 1

RATE OF VOIDS OF DIRECT JOINING SUBSTATE

| SAMPLE | SURFACE WAVENESS OF ALUMINA SUBSTRATE | MAXIMUM DIAMETER OF VOID ($\mu$m) | VOID NUMBER/ 15 cm$^2$ NOT LESS THAN 100 $\mu$m IN DIAMETER | RATE OF VOIDS (%) |
|---|---|---|---|---|
| No.1 | 4.8 $\mu$m/20 mm | BELOW 60 | NOTHING | 0 |
| No.2 | 9.6 $\mu$m/20 mm | 110 | 2 | 0.58 |
| No.3 | 14.3 $\mu$m/20 mm | 160 | 10 | 1.27 |
| No.4 | 22.7 $\mu$m/20 mm | 450 | 36 | 1.40 |
| No.5 | 25.0 $\mu$m/20 mm | 700 | 40 | 1.49 |
| No.6 | 34.3 $\mu$m/20 mm | 2,400 | 97 | 3.12 |

MESURED BY SUPERSONIC CRACK DELECTECTION DEVICE MANUFACTURED BY HITACHI KENKI (MI-SCOPE-I)

In Table 1, the samples No. 1~No. 5 other than the sample No. 6 are preferable.

Embodiment 2

As metal members, a copper plate of 0.3 mm in thickness for the circuit side and a copper plate of 0.25 mm in thickness for the heat sink side were prepared.

Also, as ceramic members, nine sheets of aluminum nitride substrates of 30×50×0.635 mm in dimension each screen printed with the paste of brazing material of Ag—Cu—Ti base and dried were prepared.

The aluminum nitride substrates were subjected to a debinding process by varying the heating temperature and holding time, respectively, in the furnace to remove the carbon contained in the binder.

A required metal-ceramic composite circuit substrate was obtained by contacting the copper plates with upper and lower surfaces of the aluminum nitride substrate and heating at a constant temperature of 850° C. to form a joint member, and etching the joint member to form a predetermined circuit.

In each of these metal-ceramic composite circuit substrates, the maximum diameter of the void, and the number and the rate of voids (each having a diameter not smaller than 100 $\mu$m per 15 cm$^2$) formed on the joint surface between the aluminum nitride substrate with the brazing material and the copper plate for circuit side at a portion where the semiconductor element (such as Si tip etc.) is installed, were measured by using the supersonic crack detection device used in the embodiment 1.

The results are shown in Table 2.

TABLE 2

RATE OF VOIDS DUE TO ACTIVE METAL METHOD

| DEBINDING TEMPERATURE | DEBINDING HOLDING TIME | MAXIMUM DIAMETER OF VOID ($\mu$m) | VOID NUMBER/ 15 cm$^2$ NOT LESS THAN 100 $\mu$m IN DIAMETER | RATE OF VOIDS (%) |
|---|---|---|---|---|
| 550 ° C. | 2 Hr | 350 | 88 | 3.43 |
| 550 | 4 | 220 | 42 | 2.50 |
| 550 | 6 | 120 | 24 | 1.81 |
| 600 | 2 | 210 | 43 | 2.62 |
| 600 | 4 | 110 | 19 | 1.38 |
| 600 | 6 | BELOW 60 | 2 | 0.34 |
| 650 | 2 | 120 | 20 | 1.47 |
| 650 | 4 | BELOW 60 | 3 | 0.41 |
| 650 | 6 | BELOW 60 | NOTHING | 0.10 |

MESURED BY SUPERSONIC CRACK DELECTECTION DEVICE MANUFACTURED BY HITACHI KENKI (MI-SCOPE-I)

After measurement, an electric power was applied on the composite substrate with Si tip as the semiconductor element mounted on the circuit surface of the substrate. It was found that the rate of voids in the substrate heated at a temperature of not less than 600° C. for at least two hours is not more than 1.49% similar to that in the embodiment 1, and that the diameter of void is smaller than 0.7 mm.

According to the metal-ceramic composite substrate of the present invention, the rate of voids on the joint surface can be controlled to not more than 1.5%, and the diameter of void can be controlled to not larger than 0.7 mm even if the same materials are used to join to each other, so that a substrate having a high thermal resistance and a high commercial value can be manufactured with low cost.

While the invention has been particularly shown and described with reference to the preferred embodiments thereof, it will be understood by those skilled in the art that various changes in form and details may be made therein without departing from the spirit and scope of the invention as defined by the appended claims.

What is claimed is:

1. A metal-ceramic composite substrate comprising: a ceramic substrate selected from a group consisting of $Al_2O_3$, AlN, BeO, SiC, $Si_3N_4$ and $ZrO_2$ and a metal plate joined directly to one main surface of the ceramic substrate, wherein the surface undulation of the ceramic substrate to be joined to the metal plate is not more than 25 μm per a length of the ceramic substrate of 20 mm and more than zero.

2. The metal-ceramic composite substrate as claimed in claim 1, wherein a percentage on a per unit surface area basis of the total surface area of a joint between said metal plate and said ceramic substrate occupied by a surface area of the voids is not more than 1.49%.

* * * * *